(12) United States Patent
Park et al.

(10) Patent No.: US 8,987,043 B2
(45) Date of Patent: Mar. 24, 2015

(54) ORGANIC LIGHT EMITTING DIODE DISPLAY AND METHOD FOR MANUFACTURING ORGANIC LIGHT EMITTING DIODE DISPLAY

(75) Inventors: Yong-Hwan Park, Yongin (KR); Sang-Joon Seo, Yongin (KR); Jae-Seob Lee, Yongin (KR); Seung-Hun Kim, Yongin (KR); Jin-Kwang Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 15 days.

(21) Appl. No.: 13/300,176

(22) Filed: Nov. 18, 2011

(65) Prior Publication Data

US 2012/0305981 A1 Dec. 6, 2012

(30) Foreign Application Priority Data

Jun. 1, 2011 (KR) ........................ 10-2011-0052904

(51) Int. Cl.
*H01L 51/52* (2006.01)

(52) U.S. Cl.
CPC ......... *H01L 51/5253* (2013.01); *H01L 51/5246* (2013.01); *H01L 2227/326* (2013.01); *H01L 2251/5338* (2013.01)
USPC ...................................... 438/99; 257/E51.02

(58) Field of Classification Search
CPC .................. H01L 51/5246; H01L 51/5253
USPC ............. 257/29, 40, 88; 438/99, 127; 216/24; 313/46, 504
See application file for complete search history.

(56) References Cited

U.S. PATENT DOCUMENTS

| 6,803,245 | B2 * | 10/2004 | Auch et al. ...................... 438/26 |
| 6,872,114 | B2 * | 3/2005 | Chung et al. ..................... 445/24 |
| 8,309,379 | B2 * | 11/2012 | Park et al. ....................... 438/34 |
| 2011/0134018 | A1 | 6/2011 | Seo et al. |

FOREIGN PATENT DOCUMENTS

| KR | 1020040053495 | 6/2004 |
| KR | 1020070047114 | 5/2007 |
| KR | 1020080013068 | 2/2008 |

\* cited by examiner

*Primary Examiner* — Matthew W Such
*Assistant Examiner* — Warren H Kilpatrick
(74) *Attorney, Agent, or Firm* — Knobbe Martens Olson & Bear LLP

(57) ABSTRACT

A method of manufacturing an OLED display includes: forming an organic light emitting element on a first substrate; forming, on the organic light emitting element, a thin film encapsulation layer that seals the organic light emitting element with the first substrate; providing a second substrate; forming a flexible protection layer on the second substrate; attaching the first substrate and the second substrate to each other; and separating the second substrate from the flexible protection layer.

6 Claims, 12 Drawing Sheets

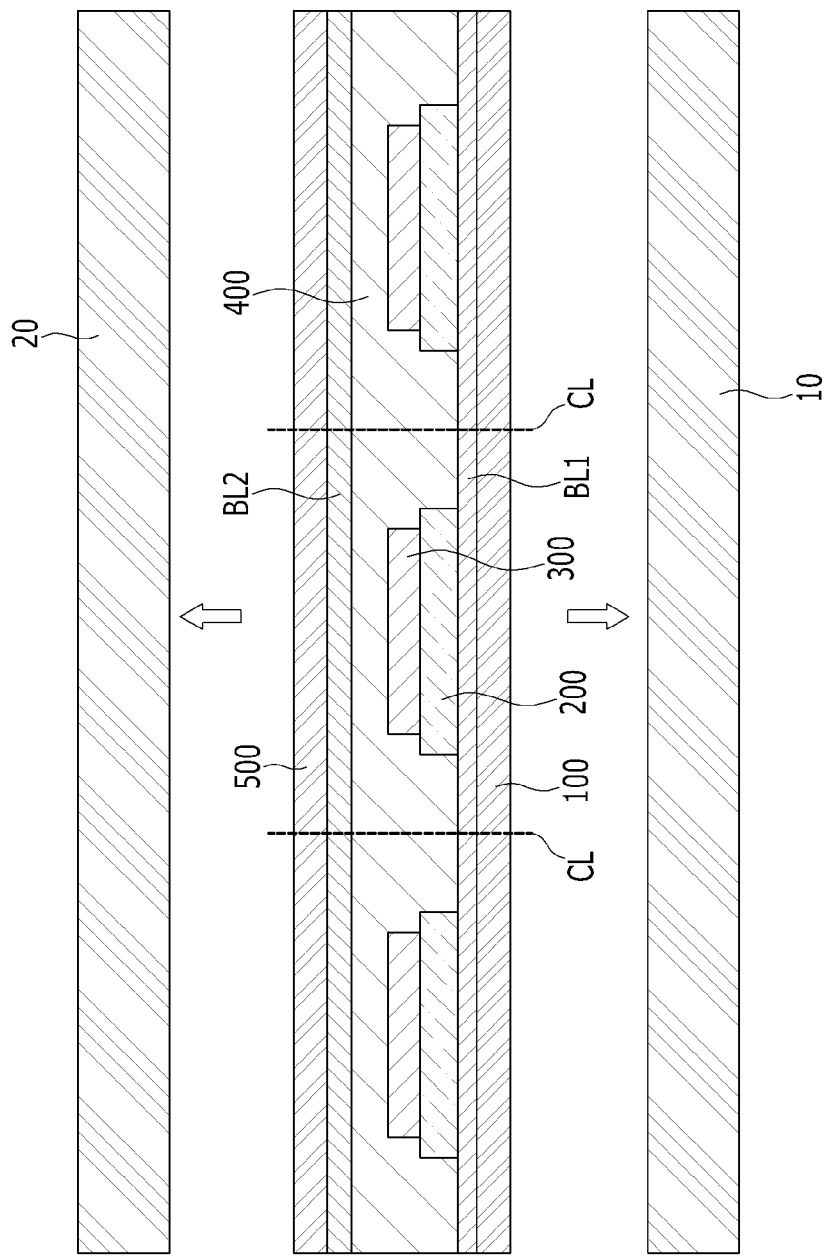

ORGANIC LIGHT EMITTING DIODE DISPLAY AND METHOD FOR MANUFACTURING ORGANIC LIGHT EMITTING DIODE DISPLAY

CROSS-REFERENCE TO RELATED APPLICATIONS

This application claims priority to and the benefit of Korean Patent Application No. 10-2011-0052904 filed in the Korean Intellectual Property Office on Jun. 1, 2011, the entire contents of which are incorporated herein by reference.

BACKGROUND

1. Field

The described technology relates generally to an organic light emitting diode (OLED) display, and a manufacturing method of an OLED display. More particularly, the described technology relates to an OLED display including a thin film encapsulation layer as an encapsulation member and a manufacturing method of an OLED display.

2. Description of Related Technology

Display devices display images, and recently, organic light emitting diode (OLED) displays have been in the spotlight.

An organic light emitting diode (OLED) generally display has a self-emitting characteristic and does not need a separate light source, such that the thickness and weight thereof are decreased, compared to a liquid crystal display. The organic light emitting diode (OLED) display typically has high-grade characteristics such as low power consumption, high luminance, high reaction speed, and the like.

In general, the OLED display includes a substrate, an organic light emitting diode disposed on the substrate and displaying an image, and an encapsulation member facing the substrate while interposing the organic light emitting diode therebetween to encapsulate the organic light emitting diode.

Recently, a flexible OLED display using a thin film encapsulation layer as an encapsulation member has been developed.

However, a conventional flexible OLED display needs to attach a flexible protection layer such as a polymer film to a thin film encapsulation layer to protect the thin film encapsulation layer from external interference. The protection layer cannot be easily attached to the thin film encapsulation layer due to movement of the flexible protection layer. Particularly, when the OLED display is large in size, the flexible protection layer is also large-sized, and accordingly attaching the protection layer to the thin film encapsulation layer becomes more difficult.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

One embodiment provides a manufacturing method of an OLED display that can easily handle a flexible protection layer.

Another embodiment provides an OLED display of which a flexible protection layer is easily attached to a thin film encapsulation layer.

One aspect provides a manufacturing method of an OLED display, including: forming an organic light emitting element on a first substrate; forming, on the organic light emitting element, a thin film encapsulation layer that seals the organic light emitting element with the first substrate; providing a second substrate; forming a flexible protection layer on the second substrate; attaching the first substrate and the second substrate to each other; and separating the second substrate from the flexible protection layer.

The flexible protection layer may include resin.

Forming the flexible protection layer on the second substrate may include forming a sacrificial layer between the second substrate and the flexible protection layer, and separating the second substrate from the flexible protection layer may include removing the sacrificial layer.

The manufacturing method of the OLED display further includes forming the first substrate on a mother board and separating the mother board from the first substrate, and the first substrate may include flexible resin.

The thin film encapsulation layer may include only a single-layered inorganic layer.

A second aspect of the present invention provides an OLED display manufactured by the manufacturing method of the OLED display.

The flexible protection layer may have a thickness in a range between about 1 um to about 100 um.

According to one embodiment, a manufacturing method of an OLED display that can easily handle a flexible protection layer is provided.

In addition, an OLED display of which a flexible protection layer is easily attached to a thin film encapsulation layer is provided.

BRIEF DESCRIPTION OF THE DRAWINGS

FIG. 11 and FIG. 12 illustrate another embodiment of the manufacturing method of the OLED display.

DETAILED DESCRIPTION OF CERTAIN INVENTIVE EMBODIMENTS

Figure 1:
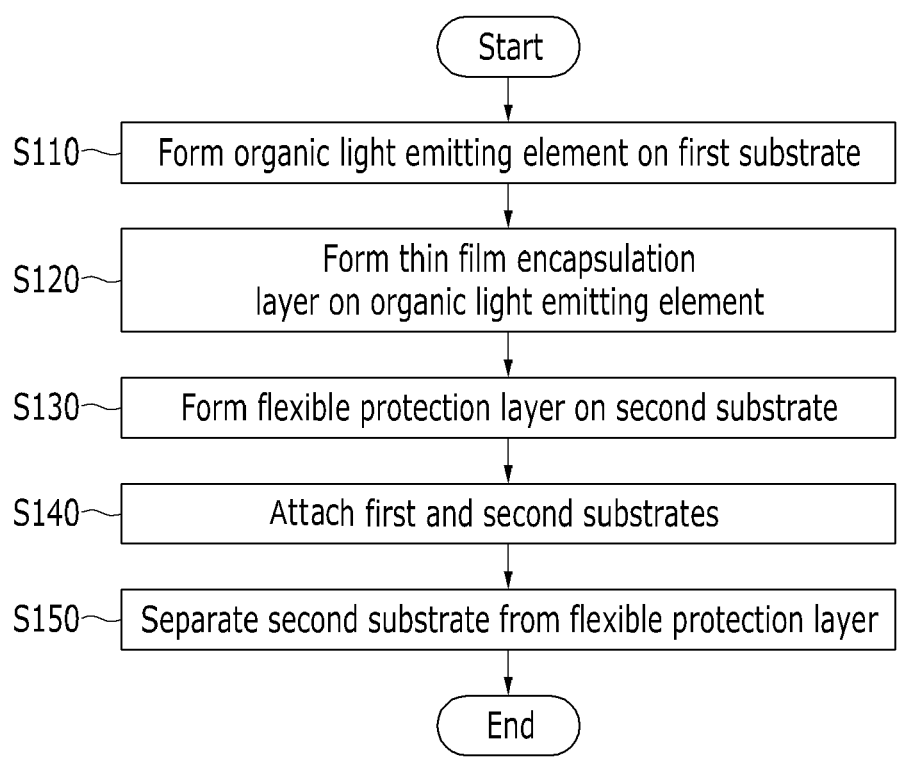
FIG. 1 is a flowchart of one embodiment of a manufacturing method of an organic light emitting diode (OLED) display.

In the following detailed description, certain embodiments are shown and described, simply by way of illustration. As those skilled in the art would realize, the described embodiments may be modified in various ways, without departing from the spirit or scope of the present invention.

Accordingly, the drawings and description are to be regarded as illustrative in nature and not restrictive. Like reference numerals generally designate like elements throughout the specification In addition, the size and thickness of each component shown in the drawings are arbitrarily shown for understanding and ease of description, but the present invention is not limited thereto.

In the drawings, the thickness of layers, films, panels, regions, etc., may be exaggerated for clarity. In the drawings, for understanding and ease of description, the thicknesses of some layers and areas may be exaggerated. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising", will be understood to imply the inclusion of stated elements but not the exclusion of any other elements. Further, throughout the specification, "on" implies being positioned above or below a target element and does not imply being necessarily positioned on the top on the basis of a gravity direction.

Hereinafter, one embodiment of a manufacturing method of an organic light emitting diode (OLED) display will be described with reference to FIG. 1 to FIG. 6.

FIG. 1 is a flowchart of an embodiment of a manufacturing method of an OLED display. FIG. 2 to FIG. 6 illustrate an embodiment of the manufacturing method of the OLED display.

Figure 2:
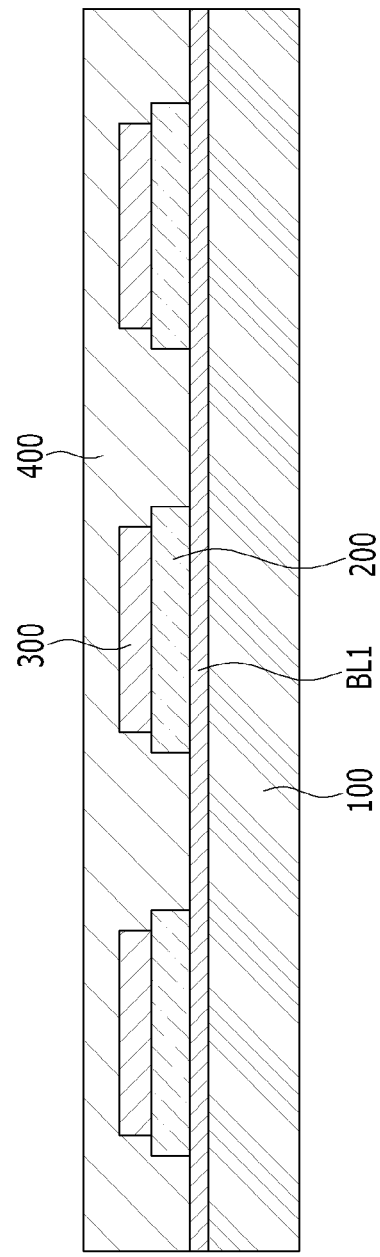
FIG. 2 to FIG. 6 illustrate an embodiment of the manufacturing method of the OLED display.

As shown in FIG. 1 and FIG. 2, an organic light emitting element 300 is formed on a first substrate 100 (S110).

A plurality of wire portions 200 arranged at a distance from each other, and a plurality of organic light emitting elements 300 arranged at a distance from each other are formed on the first substrate 100. The first substrate 100 is made from a material including at least one of an inorganic material such as glass, resin, or metal. The material may be light-reflective, light-transmissive, light-absorptive, or light-transflective. A first barrier layer BL 1, including at least one of an organic layer and an inorganic layer, is disposed between the first substrate 100 and the wire portions 200. Each wire portion 200 and each organic light emitting element 300 will be described in further detail in the description of another embodiment of an OLED display.

A thin film encapsulation layer 400 is formed on the organic light emitting element 300 (S120).

The thin film encapsulation layer 400 is formed on the organic light emitting element 300 to seal the plurality of organic light emitting elements 300 together with the first substrate 100. The thin film encapsulation layer 400 includes an inorganic layer. The inorganic layer may be a single layer or a multi-layer including at least one of an aluminum oxide such as silicon oxide (SiOx), silicon nitride (SiNx), titanium oxide (TiOx), and alumina ($Al_2O_3$) and silicon oxynitride (SiON).

In some embodiments, the thin film encapsulation layer 400 includes a single-layered inorganic layer. In other embodiments, the thin film encapsulation layer 400 may be formed by alternately layering at least one organic layer and at least one inorganic layer. The organic layer may be a single or multi layer including a resin such as polyethylene terephthalate (PET), polyimide (PI), and polycarbonate (PC), or may be a single or multi layer including engineering plastic including at least one of glass fiber reinforced plastic (FRP), polyethyleneterephthalate (PET), and polymethylmethacrylate (PMMA). The inorganic layer may be a single or multi layer including at least one of aluminum oxide such as silicon oxide (SiOx), silicon nitride (SiNx), titanium oxide (TiOx), and alumina ($Al_2O_3$) and silicon oxynitride.

In some embodiments, the following process is performed after the thin film encapsulation layer 400 is formed on the organic light emitting element 300. In other embodiments, the following process may be performed after the organic light emitting element 300 performed. In such embodiments, forming of the thin film encapsulation layer 400 may be omitted.

Figure 3:
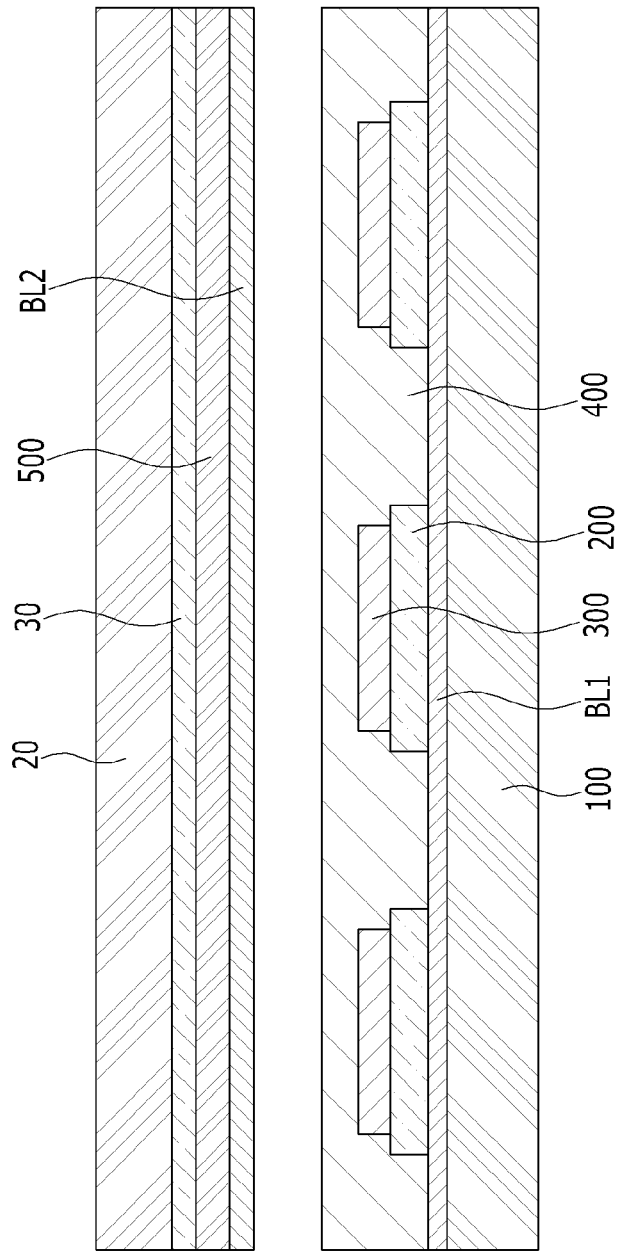

As shown in FIG. 3, a flexible protection layer 500 is formed on the second substrate 20 (S130).

The second substrate 20 may be rigid and include at least one of an inorganic material such as glass, resin, or metal. A sacrificial layer 30, a flexible protection layer 500, and a second barrier layer BL2 having at least one of an organic layer and an inorganic layer are sequentially formed on the second substrate. The sacrificial layer 30 may be an insulating layer including at least one of metal, an amorphous material, silicon oxide, silicon nitride, and a metal oxide. The flexible protection layer 500 includes a resin and has a thickness between about 1 um to about 100 um. In some embodiments, the flexible protection layer 500 may be a polymer film. Since the flexible protection layer 500 has the above-stated thickness and flexible characteristic, it may be moved due to external interference or stress, but the flexible protection layer 500 remains fixed by the second substrate 20 because it is formed on the rigid second substrate 20.

Figure 4:
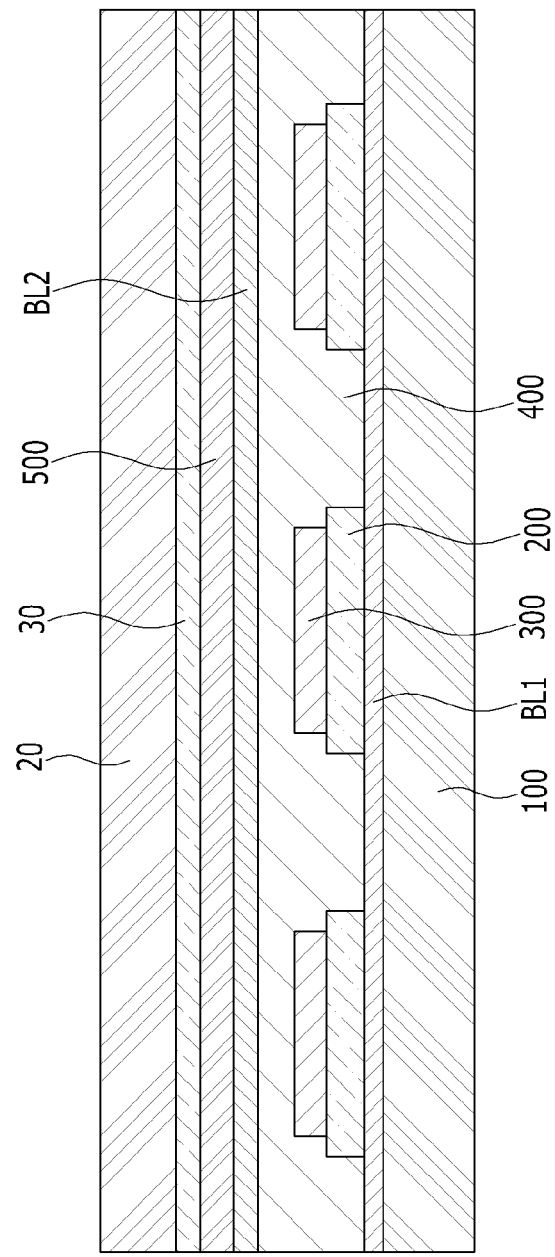

As shown in FIG. 4, the first substrate 100 and the second substrate 20 are sealed to each other (S140).

The first substrate 100 and the second substrate 20 are sealed to each other such that the flexible protection layer 500 and the thin film encapsulation layer 400 are arranged opposite to each other. The attaching between the first substrate 100 and the second substrate 20 may be performed by forming an adhesive layer on at least one of a surface of the thin film encapsulation layer 400 and a surface of the second barrier layer BL2.

The flexible protection layer 500 is attached on the thin film encapsulation layer 400 together with the second substrate 20. The flexible protection layer 500 is rigidly fixed to the second substrate 20. Accordingly, the flexible protection layer 500 can be easily attached to the thin film encapsulation layer 400 without having a difficulty in handling of the flexible protection layer 500 due to movement of the flexible protection layer 50. Although the first substrate 100 is large-sized, the flexible protection layer 500 that is large in size corresponding to the first substrate 100 is attached to the thin film encapsulation layer 400 in the state of being rigidly fixed by the second substrate 20, and therefore the flexible protection layer 500 can be easily attached to the thin film encapsulation layer 400. Further, although the thickness of the flexible protection layer 500 is less than about 1 um, the flexible protection layer 500 is attached to the thin film encapsulation layer 400 while being rigidly fixed by the second substrate 20 so that the flexible protection layer 500 can be easily attached to the thin film encapsulation layer 400. The flexible protection layer 500 is attached to the thin film encapsulation layer 400 by fixing the same to the second substrate 20 so that the flexible protection layer 500 can be easily attached to the thin film encapsulation layer 400 without considering movement of the flexible protection layer 500. The flexible protection layer 500 may be an optical film of a polarizing or phase difference film.

Figure 5:
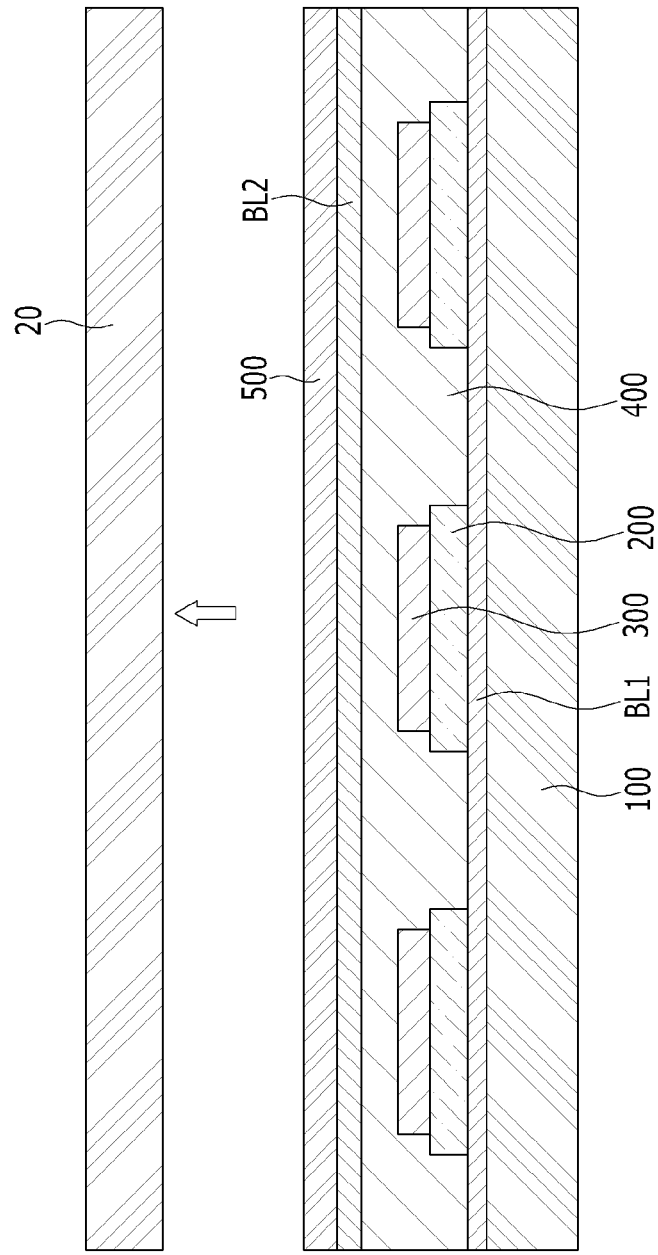

As shown in FIG. 5, the second substrate 20 is separated from the flexible protection layer 500 (S150).

The second substrate 20 is separated from the flexible protection layer 500 by removing the sacrificial layer 30 using a lift-off or wet-etching process. The separated second substrate 20 may be recycled in the next process.

Figure 6:
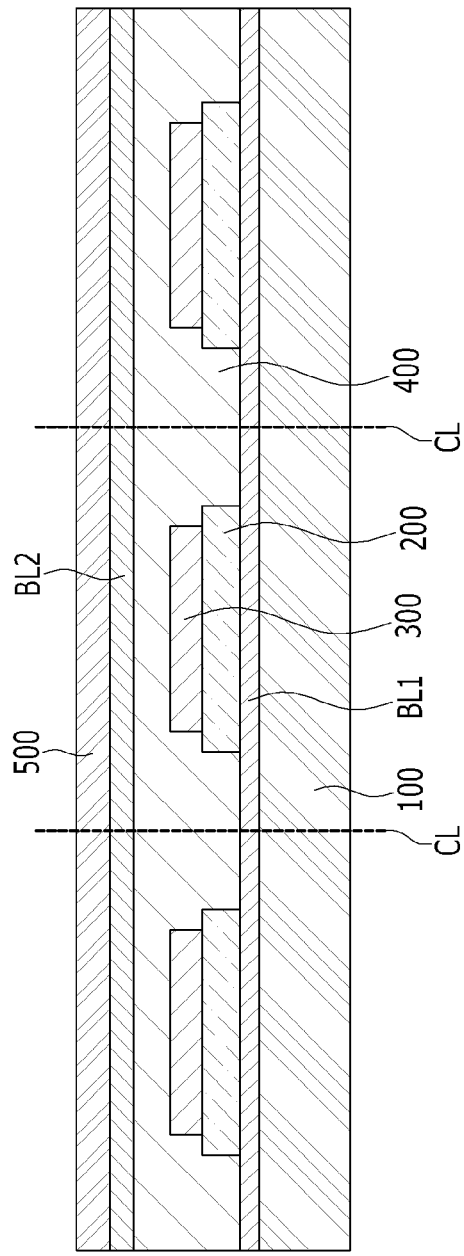

As shown in FIG. 6, another embodiment of an OLED display (to be described below) is manufactured by cutting the first substrate 100, the first barrier layer BL1, the thin film encapsulation layer 400, the second barrier layer BL2, and the flexible protection layer 500 along an imaginary cutting line CL disposed between neighboring organic light emitting elements 300 among the plurality of organic light emitting elements 300 using a cutting means such as laser or a diamond cutter.

As described, according to an embodiment of the manufacturing method of the OLED display, the flexible protection layer 500 is attached to the thin film encapsulation layer 400 together with the second substrate 20 while being rigidly fixed by the second substrate 20 so that the flexible protection layer 500 can be easily attached to the thin film encapsulation layer 400 without having a difficulty in handling of the flexible protection layer 500 due to movement of the flexible protection layer 500. As described, as the flexible protection layer 500 attached to the thin film encapsulation layer 400 can be easily handled by using an embodiment of the manufacturing method of the OLED display, an OLED display large in size and slim in thickness can be easily manufactured by setting the thickness of the flexible protection layer 500 to, for example, about 1 um.

Hereinafter, another embodiment of an OLED display will be described with reference to FIG. 7 to FIG. 9. Another embodiment of the OLED display may be manufactured by the manufacturing method of the OLED display according to the above-described embodiment.

Figure 7:
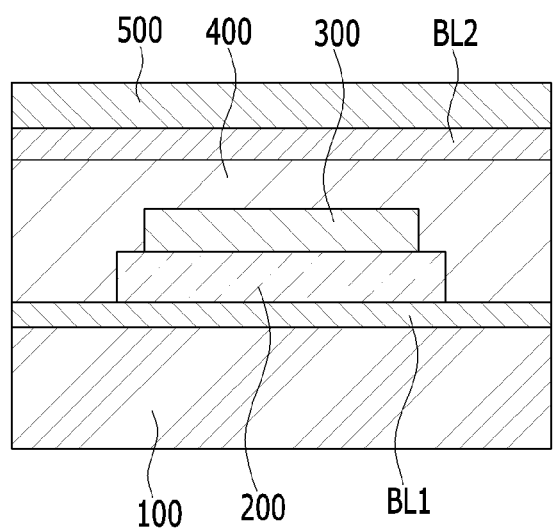
FIG. 7 is a cross-sectional view of an embodiment of an OLED display.

FIG. 7 is a cross-sectional view of another embodiment of an OLED display.

As shown in FIG. 7, an embodiment of the OLED display includes a first substrate 100, a first barrier layer BL1, a wire portion 200, an organic light emitting element 300, a thin film encapsulation layer 400, a second barrier layer BL2, and a flexible protection layer 500.

The first substrate 100 may be flexible, making the entire OLED display flexible. The thin film encapsulation layer 400 may be formed as a thin film, and the flexible protection layer 500 may be slim.

The wire portion 200 includes first and second thin film transistors 11 and 21 (shown in FIG. 8), and drives the organic light emitting element 300 by transmitting a signal thereto. The organic light emitting element 300 displays an image by emitting light according to the signal transmitted from the wire portion 200.

The organic light emitting element 300 is disposed on the wire portion 200.

Hereinafter, an internal structure of another embodiment of the OLED display will be described with reference to FIG. 8 and FIG. 9.

Figure 8:
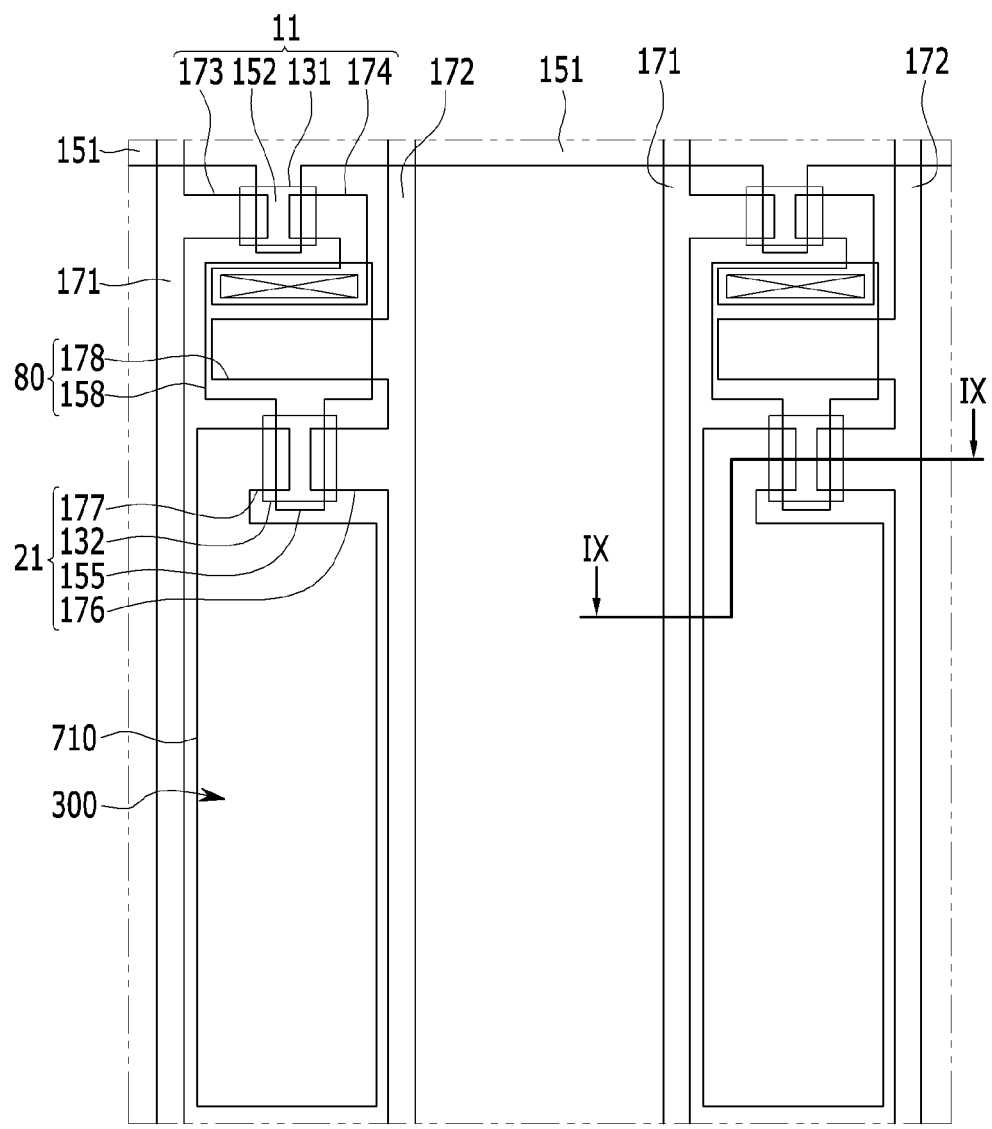
FIG. 8 is a layout view of a pixel structure of the embodiment of an OLED display shown in FIG. 7.

FIG. 8 is a layout view of a pixel structure of an embodiment of the OLED display. FIG. 9 is a cross-sectional view of FIG. 8, taken along the line IX-IX.

Figure 9:
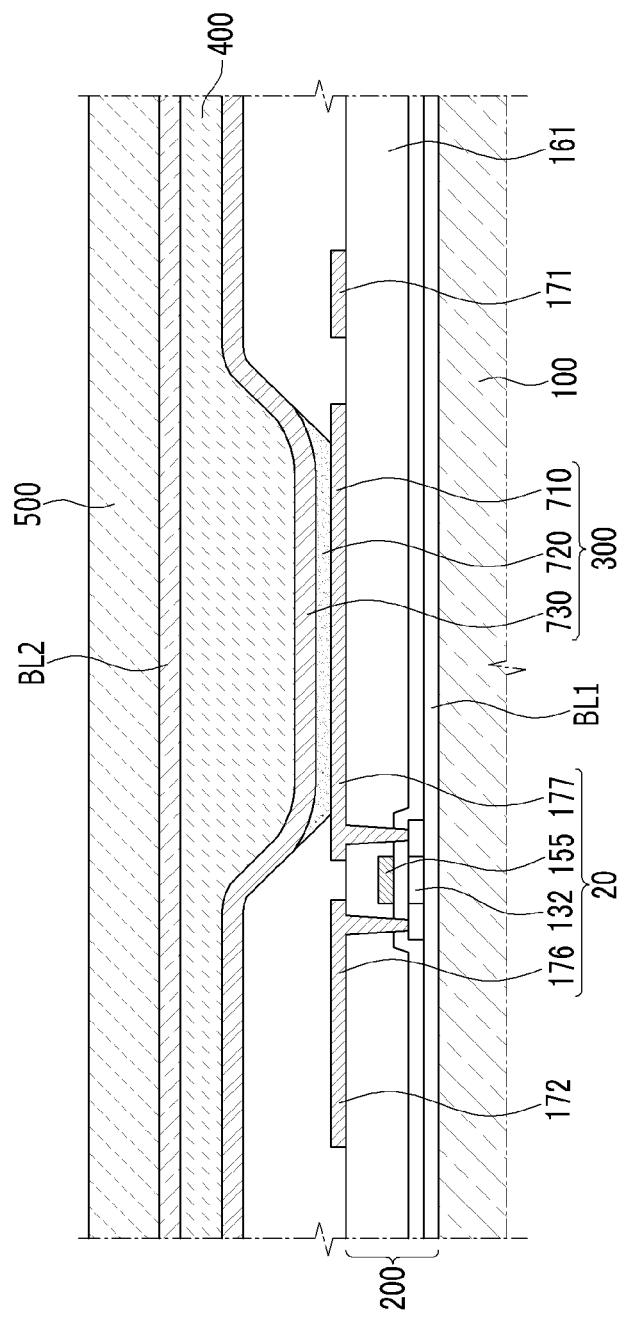
FIG. 9 is a cross-sectional view of FIG. 8, taken along the line IX-IX.

The detailed structure of one embodiment of the wire portion 200 and the organic light emitting element 300 are shown in FIG. 8 and FIG. 9, but other embodiments are also possible. The structure of the wire portion 200 and the organic light emitting element 300 may be variously modified within a range that can be realized by a person skilled in the art. For example, in the accompanying drawing, an active matrix (AM) organic light emitting diode display having a 2Tr-1Cap structure that includes two thin film transistors (TFTs) and one capacitor in one pixel is shown as an OLED display. In other embodiments, the number of thin film transistors, the number of capacitors, and the number of wires of the OLED display may differ. The pixel represents a minimum unit displaying an image, and the OLED displays an image using a plurality of pixels.

As shown in FIG. 8 and FIG. 9, an embodiment of the OLED display includes a switching thin film transistor 11, a driving thin film transistor 21, a capacitor 80, and an organic light emitting element 300 which are formed in each pixel. The switching thin film transistor 11, the thin film transistor 21, and the capacitor 80 are collectively referred to as a wire portion 200. The wire portion 200 further includes a gate line 151, a data line 171, and a common power line 172. The gate lines 151 are arranged in one direction, and the common power lines 172 cross the gate lines 151 and the data lines 171 in an insulated manner. In some embodiments, one pixel may be defined as the boundary of the gate line 151, the data line 171, and the common power line 172.

The organic light emitting element 300 includes a first electrode 710, an organic emission layer 720 formed on the first electrode 710, and a second electrode 730 formed on the organic emission layer 720. In some embodiments, the first electrode 710 may be an anode, which is a hole injection electrode, and the second electrode 730 may be a cathode, which is an electron injection electrode. In other embodiments, the first electrode 710 may be a cathode and the second electrode 730 may be an anode. Holes and electrodes are injected into the organic emission layer 720 respectively from the anode 710 and the cathode 730. When an exciton, in which a hole and an electron injected into the organic emission layer 720 are coupled to each other, falls from an excited state to a ground state, light emission occurs. At least one of the first electrode 710 and the second electrode 730 may have a light transmissive structure, and accordingly, the organic light emitting element 300 displays an image by emitting light to at least one direction of the first substrate 100 and the flexible protection layer 500.

The capacitor 80 includes a pair of capacitor plates 158 and 178 arranged interposing an interlayer insulating layer 161 therebetween. The interlayer insulating layer 161 may be a dielectric material, and capacitance of the capacitor 80 is determined by charges charged in the capacitor 80 and a voltage between the two capacitor plates 158 and 178

The switching thin film transistor 11 includes a switching semiconductor layer 131, a switching gate electrode 152, a switching source electrode 173, and a switching drain electrode 174. The driving thin film transistor 21 includes a driving semiconductor layer 132, a driving gate electrode 155, a driving source electrode 176, and a driving drain electrode 177.

The switching thin film transistor 11 is used as a switch to select a pixel for light emission. The switching gate electrode 152 is connected to the gate line 151. The switching source electrode 173 is connected to the data line 171. The switching drain electrode 174 is distanced from the switching source electrode 173 and is connected with the capacitor plate 158 of the two capacitor plates 158 and 178.

The driving thin film transistor 21 applies driving power to the second electrode 730 for light emission of an organic emission layer 720 of an organic light emitting diode 300 of the selected pixel. The driving gate electrode 155 is connected with the capacitor plate 158 that is connected with the switching drain electrode 174. The driving source electrode 176 and the other capacitor plate 178 are respectively connected with the common power line 172. The driving drain electrode 177 is disposed at the same layer where the first electrode 710 is disposed, and is connected with the first electrode 710.

In one embodiment of the OLED display, the driving drain electrode 177 and the first electrode 710 are disposed on the same layer, but a driving drain electrode and a first electrode other embodiments of the OLED display may be disposed in different layers and may access the first electrode through an opening formed in an insulating layer.

With such a structure, the switching thin film transistor 11 is driven by a gate voltage applied to the gate line 151 to transmit a data voltage applied to the data line 171 to the driving thin film transistor 21. A voltage corresponding to a difference between a common voltage applied to the driving thin film transistor 21 from the common power line 172 and the data voltage transmitted from the switching thin film transistor 11 is stored in the capacitor 80, and a current corresponding to the voltage stored in the capacitor 80 flows to the organic light emitting element 300 through the driving thin film transistor 21 such that the organic light emitting element 300 emits light.

Referring to FIG. 7, the thin film encapsulation layer 400 and the flexible protection layer 500 are sequentially formed on the organic light emitting element 300.

The flexible protection layer 500 has a thickness in a range between about 1 um to about 100 um. In some embodiments, the flexible protection layer 500 may have a thickness of about 10 um. The flexible protection layer 500 is formed by embodiments of the manufacturing method of the OLED display, and thus the flexible protection layer 500 is disposed on the thin film encapsulation layer 400 by maintaining flatness even though it has a thickness of about 10 um.

As described, an embodiment of the OLED display is manufactured by using the embodiment of manufacturing method of the OLED display described above so that it can be large-sized with a slim thickness.

Hereinafter, another embodiment of a manufacturing method of an OLED display will be described with reference to FIG. 10 to FIG. 12.

Figure 10:
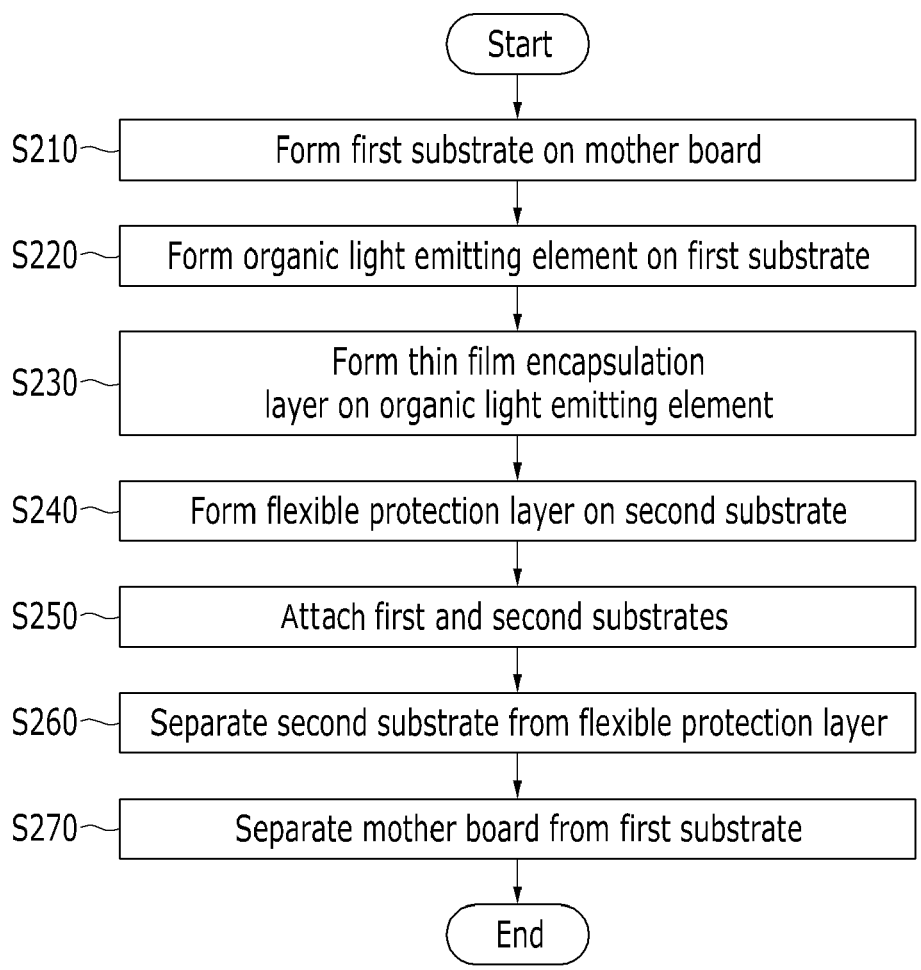
FIG. 10 is a flowchart of another embodiment of a manufacturing method of an OLED display.

Only characteristic portions that are different from the embodiments above are described FIG. 10 is a flowchart of an embodiment of a manufacturing method of an OLED display. FIG. 11 and FIG. 12 illustrate an embodiment of the manufacturing method of the OLED display.

Figure 11:
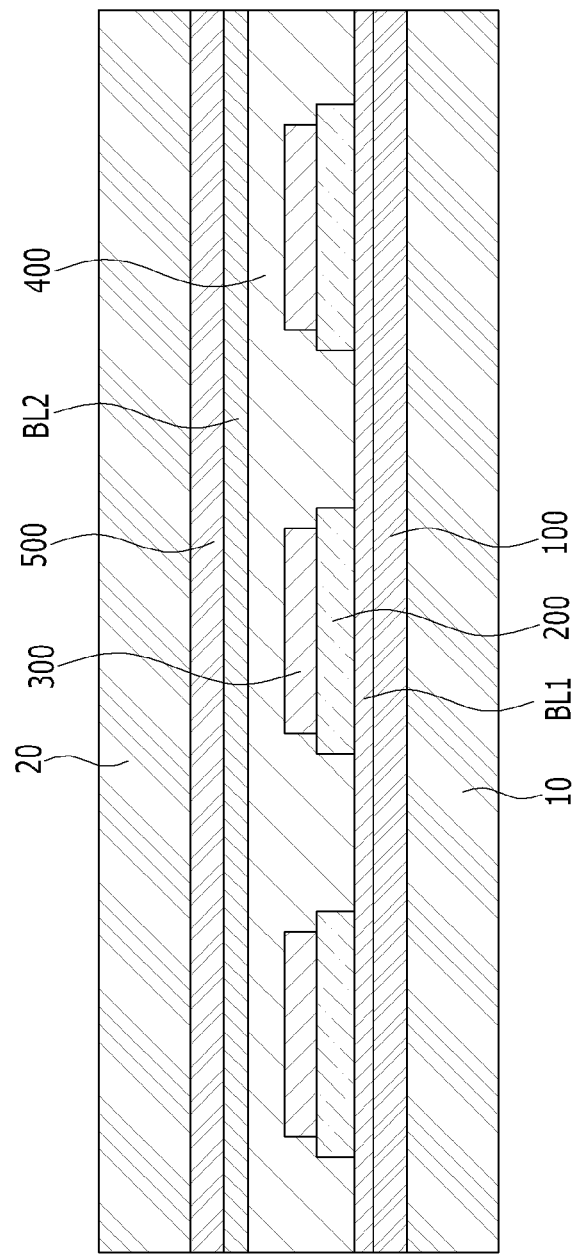

As shown in FIG. 10 and FIG. 11, a first substrate 100 is formed on a mother board 10 (S210).

The mother board 10 is rigid and includes at least one of an inorganic material such as glass, resin, or metal. The first substrate 100 formed on the mother board 10 may be a polymer film, which is flexible and includes resin. By being flexible, the first substrate 100 may be moved due to external interference or stress, but the first substrate 100 maintains a fixed state because it is formed on the rigid mother board 10.

An organic light emitting element 300 is formed on the first substrate 100 (S220).

A wire portion 200 and an organic light emitting element 300 are formed on the first substrate 100 including flexible resin.

A thin film encapsulation layer 400 is formed on the organic light emitting element 300 (S230).

A flexible protection layer 500 is formed on the second substrate 20 (S240).

Next, the first substrate 100 and the second substrate 20 are sealed to each other (S250).

As the first substrate 100 and the second substrate 20 are sealed to each other, the flexible protection layer 500 and the thin film encapsulation layer 400 are arranged opposite to each other. The attaching between the first substrate 100 and the second substrate 20 may be performed by forming an adhesive layer on at least one of a surface of the thin film encapsulation layer 400 and a surface of a second barrier layer BL2.

The flexible protection layer 500 is attached on the thin film encapsulation layer 400 together with the second substrate 20 while the first substrate 100 and the flexible protection layer 500 are being respectively fixed to the rigid mother board 10 and the rigid second substrate 20, and accordingly, the flexible protection layer 500 can be easily attached to the thin film encapsulation layer 400 without having a difficulty in handling of the flexible protection layer 500 due to movement of each of the first substrate 100 and the flexible protection layer 500.

As shown in FIG. 12, the second substrate 20 is separated from the flexible protection layer 500 (S260).

Then, the mother board 10 is separated from the first substrate 100 (S270).

The mother board 10 and the second substrate 20 separated through the above-stated process can be recycled in the next process.

An OLED display is manufactured by cutting the first substrate 100, the first barrier layer BL1, the thin film encapsulation layer 400, the second barrier layer BL2, and the flexible protection layer 500 along an imaginary cutting line CL disposed between neighboring organic light emitting elements 300 among the plurality of organic light emitting elements 300 using a cutting means such as laser or a diamond cutter.

According to an embodiment of the manufacturing method of the OLED display, the flexible protection layer 500 is attached on the thin film encapsulation layer 400 together with the second substrate while the first substrate 100 and the flexible protection layer 500 are being respectively fixed to the rigid mother board 10 and the rigid second substrate 20, and accordingly, the flexible protection layer 500 can be easily attached to the thin film encapsulation layer 400 without having a difficulty in handling of the flexible protection layer 500 due to movement of each of the first substrate 100 and the flexible protection layer 500. As the flexible protection layer 500 and the first substrate 100 attached to the thin film encapsulation layer 400 can be easily handled by using embodiments of the manufacturing method of the OLED display, an OLED display flexible, large in size, and slim in thickness can be easily manufactured by setting the thickness of first substrate 100 and the thickness of the flexible protection layer 500 to, for example, about 1 um to about 100 um.

While this disclosure has been described in connection with certain embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

First substrate 100, organic light emitting element 300, thin film encapsulation layer 400, flexible protection layer 500.

What is claimed is:

1. A method of manufacturing an organic light emitting diode (OLED) display, the method comprising:
    forming an organic light emitting element on a first substrate;
    forming, on the organic light emitting element, a thin film encapsulation layer that seals the organic light emitting element with the first substrate;
    providing a second substrate;
    forming a flexible protection layer on the second substrate;
    forming a sacrificial layer between the second substrate and the flexible protection layer;
    forming a barrier layer on the flexible protection layer;
    attaching the first substrate and the second substrate to each other by attaching the barrier layer to the thin encapsulation layer; and separating the second substrate from the flexible protection layer by removing the sacrificial layer simultaneously from both the second substrate and the flexible protection layer.

2. The method of manufacturing of claim 1, wherein the flexible protection layer comprises resin.

3. The method of manufacturing of claim 1, further comprising forming the first substrate on a mother board and separating the mother board from the first substrate, wherein the first substrate comprises flexible resin.

4. The method of manufacturing of claim 1, wherein the thin film encapsulation layer comprises a single-layered inorganic layer.

5. The method of manufacturing of claim 1, wherein the flexible protection layer comprises at least one of a polarizing film or a phase difference film.

6. The method of manufacturing of claim 1, wherein the sacrificial layer comprises at least one of metal, amorphous material, silicon oxide, silicon nitride or metal oxide.

* * * * *